United States Patent
Shimamura et al.

(10) Patent No.: US 10,447,956 B2
(45) Date of Patent: Oct. 15, 2019

(54) ANALOG-TO-DIGITAL CONVERTER CIRCUITRY WITH OFFSET DISTRIBUTION CAPABILITIES

(71) Applicant: SEMICONDUCTOR COMPONENTS INDUSTRIES, LLC, Phoenix, AZ (US)

(72) Inventors: Nobutaka Shimamura, Kaweasaki (JP); Kazuhisa Suzuki, Urayasu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 282 days.

(21) Appl. No.: 15/251,950

(22) Filed: Aug. 30, 2016

(65) Prior Publication Data

US 2018/0063457 A1    Mar. 1, 2018

(51) Int. Cl.

| | |
|---|---|
| *H04N 5/369* | (2011.01) |
| *H03M 1/00* | (2006.01) |
| *H03M 1/06* | (2006.01) |
| *H03M 1/12* | (2006.01) |
| *H04N 5/376* | (2011.01) |
| *H04N 5/378* | (2011.01) |
| *H03M 1/56* | (2006.01) |
| *H04N 5/357* | (2011.01) |

(52) U.S. Cl.
CPC .......... *H04N 5/3698* (2013.01); *H03M 1/002* (2013.01); *H03M 1/0607* (2013.01); *H03M 1/0639* (2013.01); *H03M 1/12* (2013.01); *H03M 1/123* (2013.01); *H03M 1/56* (2013.01); *H04N 5/3577* (2013.01); *H04N 5/378* (2013.01); *H04N 5/3765* (2013.01)

(58) Field of Classification Search
CPC .. H04N 5/3698; H04N 5/3577; H04N 5/3765; H04N 5/378; H03M 1/002; H03M 1/0607; H03M 1/0639; H03M 1/12; H03M 1/123; H03M 1/56

See application file for complete search history.

(56) References Cited

U.S. PATENT DOCUMENTS

| | | |
|---|---|---|
| 2011/0141324 A1 | 6/2011 | Koseki |
| 2011/0279295 A1* | 11/2011 | Li .................. H03M 1/0695 341/110 |

(Continued)

*Primary Examiner* — Sinh Tran
*Assistant Examiner* — Zhenzhen Wu
(74) *Attorney, Agent, or Firm* — Treyz Law Group, P.C.; Tianyi He

(57) ABSTRACT

Analog-to-digital converter (ADC) circuitry may receive multiple analog signals and output corresponding digital signals. During the conversion process, comparators may receive the analog signals and a ramp waveform and compare the two inputs to generate logic signals. The logic signals correspond to digital signals that are outputted by ADC circuitry. To enable offset distribution capabilities, offset distribution circuitry may be selectively coupled to the inputs of the comparators. The offset distribution circuitry may include switches that couples a voltage supply providing reference voltages to the comparators. The reference voltages may be conveyed via a capacitor to the comparators as offset voltages. The offset voltages may provide may be different for different ADC units to offset power consumption of different ADC units and reduce power surges in power sources coupled to ADC circuitry.

20 Claims, 17 Drawing Sheets

(56) References Cited

U.S. PATENT DOCUMENTS

| | | | |
|---|---|---|---|
| 2012/0138775 A1* | 6/2012 | Cheon | H04N 5/361 250/208.1 |
| 2012/0262614 A1* | 10/2012 | Deng | H03M 1/0641 348/302 |
| 2014/0124651 A1 | 5/2014 | Nakahara | |
| 2015/0146060 A1* | 5/2015 | Suzuki | H04N 5/3559 348/300 |
| 2015/0180494 A1* | 6/2015 | Ohhata | H03M 1/0612 341/155 |
| 2015/0194981 A1* | 7/2015 | Tang | H03M 1/442 341/172 |
| 2016/0006969 A1 | 1/2016 | Matsumoto | |

* cited by examiner

FIG. 14

ANALOG-TO-DIGITAL CONVERTER CIRCUITRY WITH OFFSET DISTRIBUTION CAPABILITIES

BACKGROUND

This relates generally to imaging devices, and more particularly, to imaging devices having analog-digital converters (ADCs).

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out analog image signals from the image pixels. Analog-to-digital converters are used to convert the analog image signals to corresponding digital image data.

The ADCs are often single-slope ADCs having an integrator and a comparator that provide a digital output. During an integration period, the integrator is used to generate a ramp waveform that is received at a first input of the comparator. A second input of the comparator receives an analog input. The ramp waveform is compared with the analog input until the two signals are equal (e.g., when the comparator changes outputs or "inverts"). The integrator then resets and repeats the ramping behavior, and the comparator repeats the comparison process. Digital values corresponding to every time the comparator inverts are recorded. The digital values correspond to digital data that is outputted as the digital output of the ADC.

In an exemplary configuration, each column of the array of image pixels is coupled to a dedicated ADC (e.g., a dedicated single-slope ADC) for the respective column. However, during the operation of the ADC, comparator inversions and other power consuming events may be concentrated at a given time (e.g., the comparators within respective ADCs for all columns invert at the same time) leading to power line fluctuations (e.g., power spikes, current surges). The concentrated timing of comparator inversions may consequently cause counting jitters, power supply noise, linearity error, and other undesirable effects.

It would therefore be desirable to be able to provide imaging devices with improved analog-to-digital converter circuitry.

BRIEF DESCRIPTION OF THE DRAWINGS

FIG. 14 is an illustrative timing diagram for providing a schedule for the random offset distribution as shown in FIG. 13 in accordance with an embodiment

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
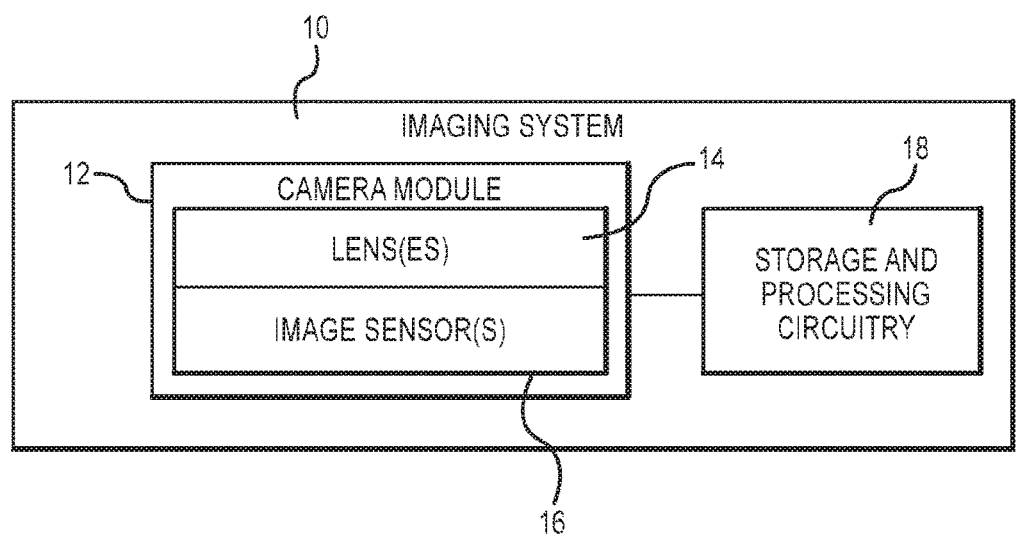
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
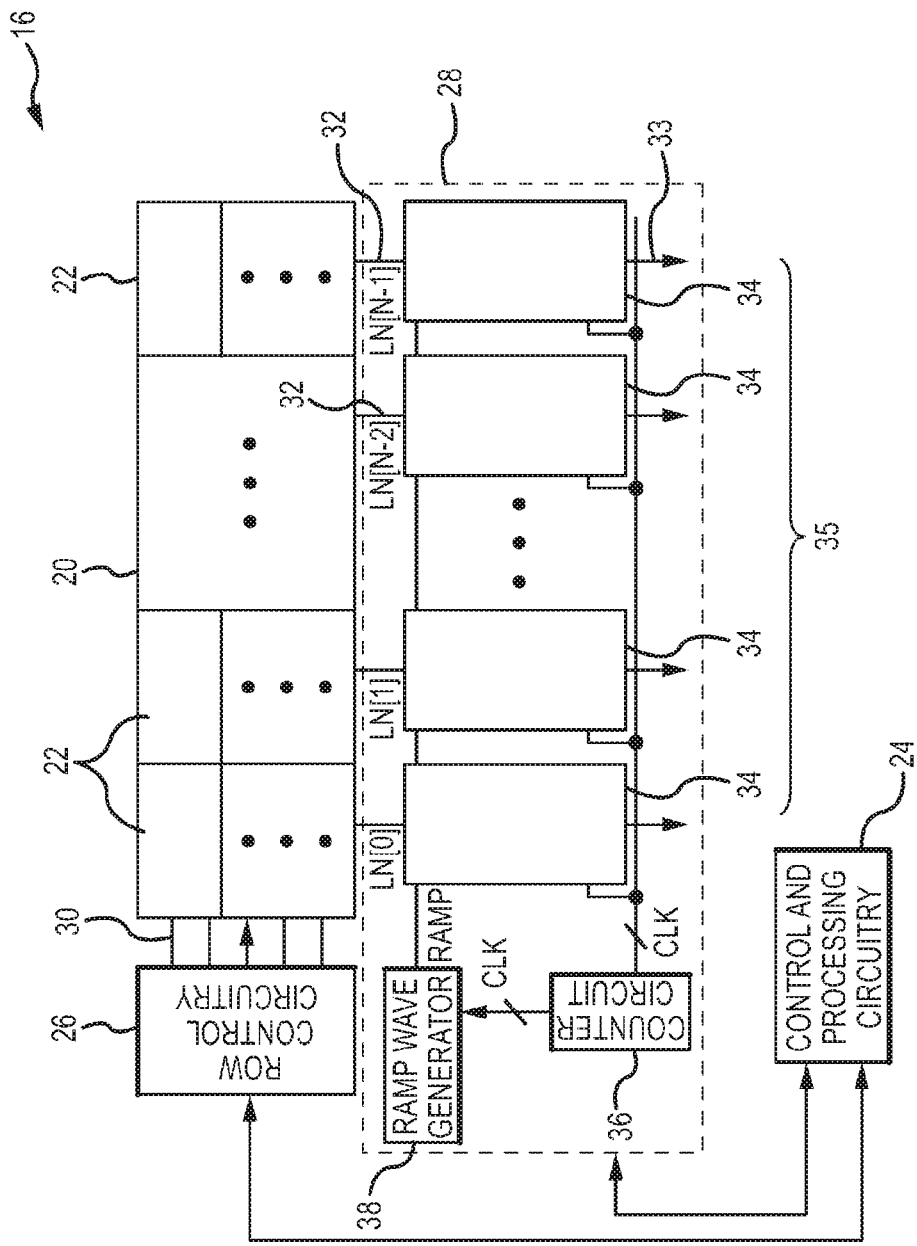
FIG. 2 is a diagram of an illustrative pixel array coupled to analog-to-digital converter circuitry in accordance with an embodiment.

As shown in FIG. 2, image sensor 16 may include a pixel array 20 (not to scale) having image sensor pixels 22 (sometimes referred to herein as image pixels or pixels, not to scale) arranged in rows and columns. Array 20 may include, for example, hundreds or thousands of rows and columns of image sensor pixels 22.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Image sensor 16 of FIG. 2 is merely illustrative. Some features within image sensor 16 (FIG. 1) are omitted in FIG. 2 for clarity reasons. If desired, additional features may also be included within image senor 16 to provide addition functionalities. As an example, array 20 may include optically dark pixels (e.g., black pixels, not shown in FIG. 2) that do not collect image signals from incident light. Dark pixels may be shielding from incident light using a shielding structure. Any suitable shielding structure may be used to prevent incident light form reaching photosensitive regions of the dark pixels. Alternatively, photosensitive region on dark pixels may be disabled using any desired method to make dark pixels insensitive to incident light. Dark pixels may be used for digital correction and/or as a physical guard band surrounding active pixels. Alternatively, dark pixels may be formed in any desired pattern.

Image sensor 16 may also include and control and processing circuitry 24. Control circuitry 24 may be coupled to row control circuitry 26 (sometimes referred to herein as row decoder or row driver) and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Pixel output signals (e.g., LN signals) may be carried off array 20 on column lines 32. As an example signal LN[0] may be carried off array 20 on a first column line 32. Signal LN[1] may be carried off array 20 on a second column line 32. Signal LN[N−2] may be carried off array 20 on a second-to-last column line 32. Signal LN[N−1] may be carried off array 20 on a last column line 32.

Image readout circuitry 28 may include sample-and-hold circuitry for sampling and temporarily storing image signals read out from array 20, amplifier circuitry, analog-to-digital converter (ADC) circuitry 35. ADC circuitry 35 may include multiple ADC circuits 34 (sometimes referred to herein as unit ADCs 34 or ADC unit circuits 34), bias circuitry, column memory, latch circuitry, or other circuitry that is coupled to one or more columns of pixels in array 20 for operating pixels 22 and for reading out image signals from pixels 22. ADC circuitry 35 in readout circuitry 28 may convert analog pixel values received from array 20 into corresponding digital pixel values (sometimes referred to as digital image data or digital pixel data). Circuitry downstream of ADC circuitry 35 may further process the digital pixel data. Image readout circuitry 28 may supply digital pixel data to control and processing circuitry 24 and/or processor 18 (FIG. 1) for pixels in one or more pixel columns. For example, digital correlated double sampling processing may take place downstream of ADC circuitry 35.

This is merely illustrative, if desired, other processing operations may occur downstream or upstream from ADC circuitry 35. Individual ADC unit circuits 34 may be collectively referred to as ADC circuitry 35.

In addition, readout circuitry may also include counter circuit 36 and ramp wave generator 38. When operating a single unit of ADC circuit 34, a ramp waveform (e.g., a waveform with a linear increase in voltage over time, or alternatively a waveform with a linear decrease in voltage over time) may be received at a terminal of ADC circuit 34. Ramp wave generator 38 may generate the ramp waveform that is received at ADC circuit 34. The ramp waveform may have a given slope. The steepness of the slope may be determined by the gain setting of ADC circuits 34. For example, the slope may be steeper in a low analog gain scenario or a low ADC bit resolution scenario that in a high analog gain scenario or a high bit resolution scenario. Because each column of array 20 may be coupled to a respective ADC circuit 34, ramp wave generator 38 may generate multiple ramp waveforms simultaneously to operate each respective ADC circuit 34. Ramp wave generator 38 may include operational amplifiers, capacitors, integrators, or any other desirable circuitry to generated the ramp waveforms.

Each ramp waveform may be compared to each respective analog input signal using a respective comparator within ADC circuits 34. When each respective comparator inverts (e.g., when a value of analog input signal at a given time becomes larger than a respective value of the ramp waveform value at a given time, or vice versa), a digital value may be generated and stored in memory. To keep track of the digital value, a counter circuit may provide clock signals CLK to ramp wave generator 38 and multiple units of ADC circuits 34 respectively coupled to each column. Clock signals CLK provided to ramp wave generator 38 and each respective ADC circuit 34 may be the same. For example, a global clock signal (e.g., clock signal CLK) may be provided to ramp wave generator 38 and the respective ADC circuits 34. The global clock signal may have a given clock cycle. The clock cycle may be used to quantize when the digital value was generated during the comparison. Digital values may be outputted from ADC circuits 34 on data lines 33.

Figure 3A:
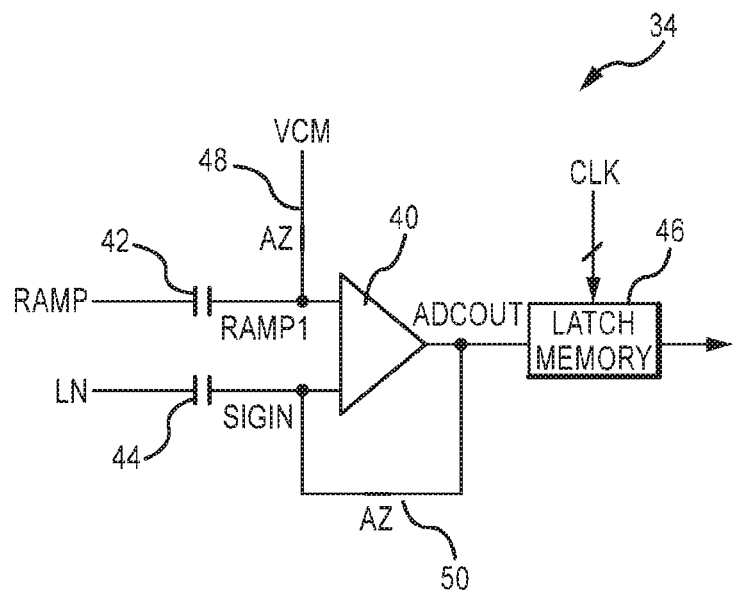
FIG. 3A is a circuit diagram of a single unit of ADC circuit within ADC circuitry.

In particular, FIG. 3A shows a circuit diagram of an exemplary ADC circuit 34 as shown in FIG. 2. ADC circuit 34 may include comparator 40. Comparator 40 may include first and second input terminals, and an output terminal. The first input terminal may receive signal RAMPIN. The first input terminal may sometimes be referred to herein as input RAMPIN. The first input terminal may be coupled to ramp signal RAMP (e.g., a ramp waveform from ramp wave generator 38) through capacitor 42. The second input terminal may receive signal SIGIN. The second input terminal may sometimes be referred to herein as input SIGIN. The second input terminal may be coupled to analog input signal LN (e.g., a reset signal from a corresponding column line, an image signal from a corresponding column line) through capacitor 44. The first input terminal may also be coupled to a reset voltage source supplying reset voltage VCM. The first input terminal may be coupled to the reset voltage source via first auto-zero switch 48. The second input terminal may also be coupled to the output terminal of comparator 40 via second auto-zero switch 50. The output terminal of comparator 40, which outputs signal ADCOUT, is coupled to latch memory 46. Output signal ADCOUT may be a logic signal. Latched memory 46 may be any desired latched memory circuitry that has set and reset capabilities. Latched memory 46 may receive a clock signal (e.g., clock signal CLK) that drives latched memory 46 according to the clock cycle of the clock signal. Latch memory may output digital data corresponding an input analog signal to downstream circuitry (e.g., line memory).

Figure 3B:
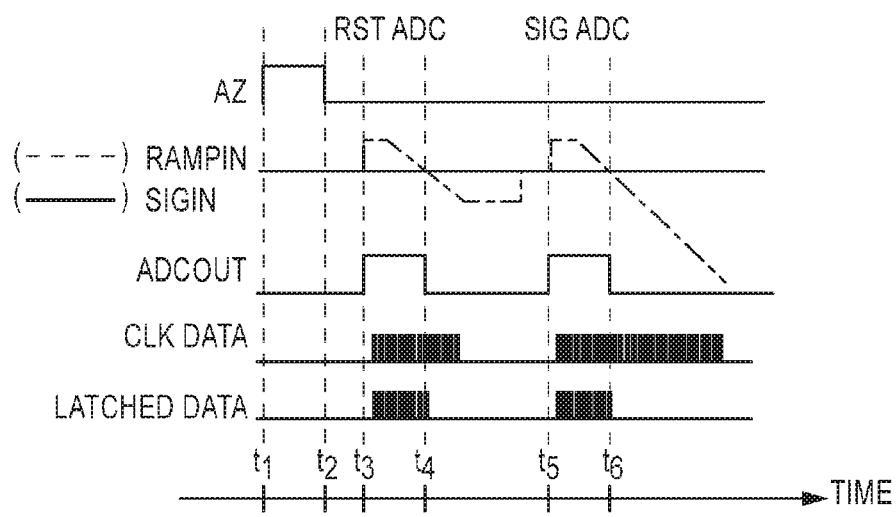
FIG. 3B is a timing diagram for operating a single unit of ADC circuit of the type shown in FIG. 3A within ADC circuitry.

An exemplary timing diagram of operating ADC circuit 34 of the type shown in FIG. 3A, is shown in FIG. 3B. From time t1 to t2, first and second auto-zero switches may be closed (e.g., enabled) to allow both input terminals to be reset to a default state (e.g., ADCOUT signal and signal SIGIN at a logic low, RAMP signal at reset voltage VCM). At time t3, an analog reset signal may begin to be read out from a respective column in a CDS readout. The analog reset signal may be provided to (e.g., received at) the second terminal of comparator 40 via capacitor 44 as signal SIGIN. Simultaneously, at time t3, a ramp signal may begin to be provided to (e.g., received at) the first terminal of comparator 40 via capacitor 42 as signal RAMPIN. Signal RAMPIN is first remains unchanged as ramp signal RAMP charges capacitor 42. Subsequently, the signal RAMPIN begins ramping corresponding to the ramp waveform of ramp signal RAMP. Beginning at time t3, output signal ADCOUT of comparator 40 may be generated and outputted to latch memory 46. In other words, signal ADCOUT may be at a logic high (e.g., a logic 1 value) and provide the logic high to latch memory 46. Latch memory 46 may begin storing values according to the logic high of signal ADCOUT and clock signal CLK received by latch memory 46 (e.g., shown as LATCHED DATA). Clock signal CLK may correspond to CLK DATA that is received by latch memory 46.

At time t4, signal RAMPIN may be equal to signal SIGIN (e.g., the voltage level of signal RAMPIN may be equal the voltage level of signal SIGIN). Consequently, signal ADCOUT may change values to output a logic low (e.g., output a logic 0 value) to latch memory 46. When the logic low value is received at latch memory 46, latch memory 46 may stop storing values. If desired, at time t4, the stored digital values from time t3 to t4 may be transferred from latch memory 46 to downstream line memory. After time t4, signal RAMPIN may continue to ramp (e.g., continue to decrease in voltage linearly if a decrease ramp signal is provided). The continued ramp in signal RAMPIN may not further affect comparator 40. The continued ramp may proceed according to the global clock signal (e.g., clock signal CLK), which may stop the ramping process. If desired, the global clock signal may continuously enable ramping of signal RAMPIN until auto-zero switches 48 and 50 are disabled (e.g., opened).

Prior to an analog image signal readout in a CDS following the analog reset signal readout, auto-zero switches 48 and 50 may be disabled to return the inputs and outputs to the default state. At time t5, a similar process as in the scenario for the analog reset signal at time t3 may occur analogously for an analog image signal. In particular, at time t5, a new ramping signal RAMPIN corresponding to signal RAMP from ramp wave generator 48 is received at comparator 40. The analog image signal is also received at comparator 40 as signal SIGIN. Signal RAMPIN and SIGNIN are compared and values are stored at latch memory 46 until time t6. Signal ADCOUT may be at a logic high values. At time t6, signal ADCOUT switches from a logic high to a logic low value and consequently stops latch memory 46 from storing any more digital values (e.g., digital data) associated with the analog image signal. The stored digital values corresponding to the analog image signal may be stored at downstream line memory.

Any additional analog values may also be converted to corresponding digital values through a similar method.

Figure 3C:
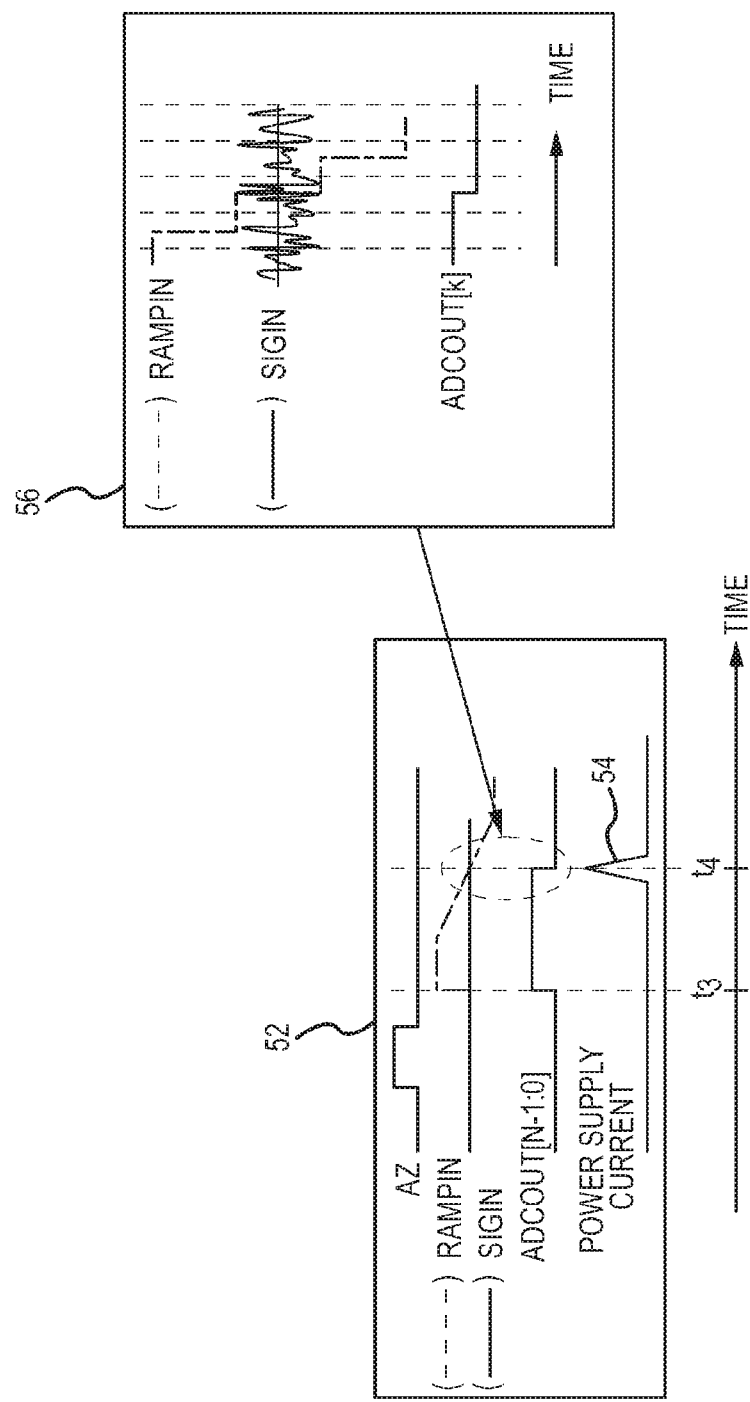
FIG. 3C is a timing diagram for simultaneously operating multiple units of ADC circuits of the type shown in FIG. 3A within ADC circuitry.

Analog values produced in a given column of array 20 may use the same ADC circuit 34 to produce corresponding digital data. Multiple ADC circuits 34 may simultaneously generate corresponding digital data from corresponding analog values from different columns within array 20. FIG. 3B shows a timing diagram of operating a single unit of ADC circuitry 34 in isolation. In contrast, FIG. 3C shows a timing diagram of operating the same single unit of ADC circuitry 34 when operating other units of ADC circuitry 34 simultaneously.

Some of the elements of FIG. 3C were previously discussed in connection to FIG. 3B. Further discussion of these elements of FIG. 3C will be omitted in order to not obscure the embodiments of FIG. 3C. As shown in portion 52 of FIG. 3C, signals ADCOUT[N−1:0](i.e., all signals from ADCOUT[N−1] to ADCOUT[0], where ADCOUT[k] corresponds to LN[k] as shown in FIG. 2) may all have the same signals received at respective ADC circuits 34. For example, during analog to digital conversion for reset signals, some or all columns may convert similar reset signals to digital data because reset signals may be low gain signals. These low gains signals have small amounts of variation in magnitude in their signals. If desired, image signals from some or all columns may also be similar in magnitude (e.g., image signals may also be low gain signals). As such, corresponding signal ADCOUT for each column may be similar or the same.

When converting the similar signals (e.g., signals that are similar in magnitude) for multiple columns using their respective ADC circuits 34, a power spike (e.g., current spike 54, a spike in power supply current provided to ADC circuits 34) may occur. In other words, since multiple circuitry within the respective ADC circuits 34 all change states (e.g., invert) at essentially the same time, a large current drain occurs from the power supply coupled to ADC circuitry 34. For example, respective comparators (e.g., analogous to comparator 40 in FIG. 3A) may invert at time t4. Respective latch memory circuitry (e.g., analogous to latch memory 46 in FIG. 3A) may stop storing values, drive previously stored values to downstream circuitry, and reset at time t4.

Portion 56 may be a magnified portion of portion 52 at time t4. As shown in portion 56 of FIG. 3C the power spike may lead to power line fluctuations and a kickback noise in signal SIGIN. Linearity error may also occur to the input ramp waveform, leading to inaccuracies in analog-to-digital conversion. Row banding may also occur because of power supply noise. It would be desirable to reduce the power spike and removed all of the undesired non-idealities caused by the power spike.

This type of power spike is apparent when using an analog auto-zero function to cancel any dominant offset (e.g., input offset for comparator 40) before analog-to-digital conversion. As a result of the auto-zero function, analog variation and subsequently digital variation for signals (e.g., reset signals, low gain signals) may be small, leading to the concentration of comparator inversions and other power consuming processes at a given time, as previously described.

Figure 4:
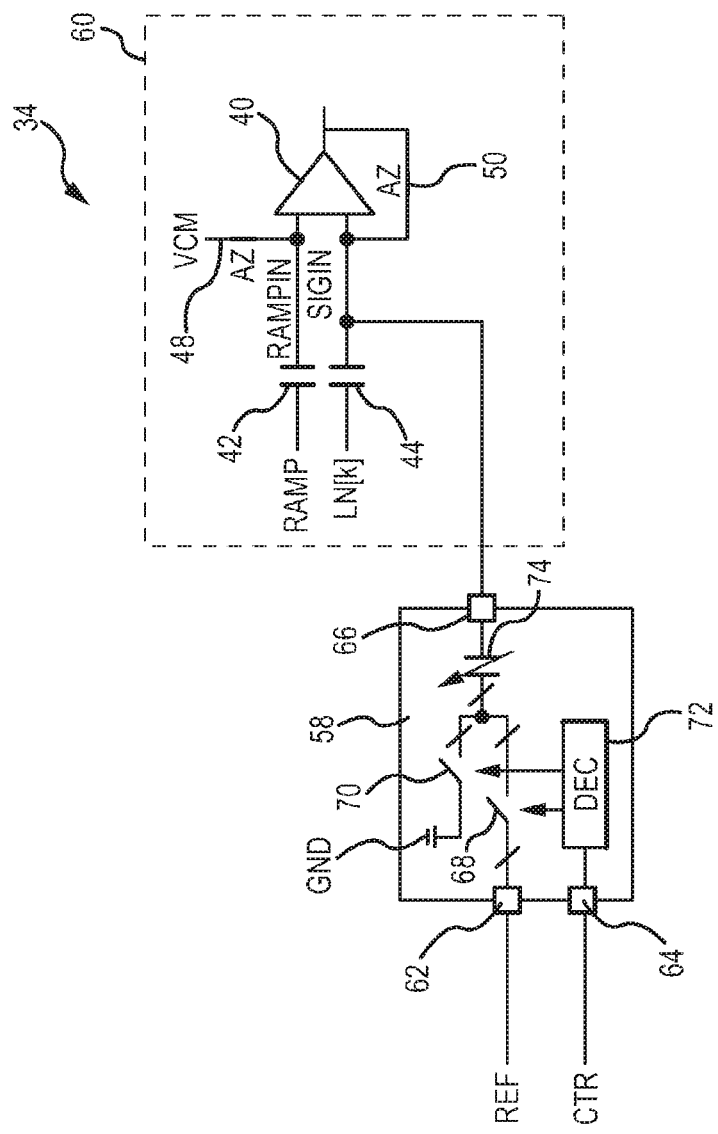
FIG. 4 is a circuit diagram of an illustrative single unit of ADC circuit within ADC circuitry that includes offset distribution capabilities in accordance with an embodiment.

FIG. 4 shows an illustrative ADC circuit 34 with offset distribution circuitry 58 (sometimes referred to herein as DAC 58 or offset injection circuitry 58). ADC circuit 34 of FIG. 4 may include portion 60, which is analogous to ADC circuit 34 as shown in FIG. 3A. Portion 60 may include conversion circuitry (e.g., a conversion circuit that converts analog signals into digital signals). In particular, conversion circuitry may include comparator 40.

ADC circuit 34 of FIG. 4 may further include offset distribution circuitry 58. Offset distribution circuitry 58 may include first and second input terminals (e.g., input terminals 62 and 64), and an output terminal (e.g., output terminal 66). Input terminal 62 may receive reference voltage REF (e.g., corresponding to an injected voltage, an offset voltage) from a corresponding voltage supply. Input terminal 64 may receive control signal CTR. Reference voltage REF may be different for each ADC circuit 34 within ADC circuitry 35 to allow for distributing offset voltage injections (e.g., providing different ADC circuits 34 with different input voltage offsets). If desired, control signal CTR may be different for each ADC circuit 34 within ADC circuitry 35. Output terminal 66 may be coupled to portion 60 of ADC circuit 34 between capacitor 44 and the respective second input of comparator 40.

Offset distribution circuitry 58 may further include, switches 68 and 70, which are controlled by decoder 72. Decoder 72 receives control signal CTR to selectively enable or disable switches 68 and 70. Every ADC circuit 34 may include a decoder analogous to decoder 72. However, settings of the analogous decodes may be different to distribute comparator inversion timing. If desired, only one of switches 68 or 70 may be enabled at a given time. Switch 68 may couple input terminal 62 to output terminal 66. Variable capacitor 74 may be interposed between switch 68 and output terminal 66. Switch 70 may couple a ground terminal GND to output terminal 66. Variable capacitor 74 also be interposed between switch 70 and output terminal 66. When switch 68 is enabled (e.g., closed) variable capacitor 74 may convey reference voltage REF to comparator input SIGIN as an injected voltage or offset voltage.

Using offset distribution circuitry 58, a voltage offset may be provided to the input of comparator 40 at which signal SIGIN is received (sometimes referred to herein as input SIGNIN). The voltage offset may adjust signal SIGIN received at comparator 40. For example, if a positive voltage offset is provided (e.g., injected) to the input of comparator 40, signal SIGIN received at comparator 40 may have a lower voltage than the corresponding voltage of signal LN. Alternatively, if a negative voltage offset is provided (e.g., injected) to the input of comparator 40, signal SIGIN received at comparator 40 may have a higher voltage than the corresponding voltage of signal LN. If desired, minimal or no offset may be injected into the input of comparator 40. Note that positive and negative voltage offset does not necessarily relate to the polarity of any signals. Rather, positive and negative voltage offset relates to how signal SIGIN may be affected by the voltage offset as previously described in this paragraph.

Offset voltages may be injected to either one or both of the inputs for comparator 40. Comparator 40 may be included within conversion circuitry of ADC circuit 34. In other words, offset voltages may be injected to conversion circuitry with ADC circuit 34. Offset direction (e.g., offset polarity, positive/negative voltage offset as previously described), offset voltage amount (e.g., magnitude of offset), and offset pattern (e.g., which offset voltage is provided to which column ADC circuit 34) may be parameters controlled by design. The offset voltages may be canceled out during a correlated double sampling readout because a reset signal is provided with a given offset at comparator input SIGIN and a corresponding image signal is provided with the same given offset at comparator input SIGIN.

FIG. 4 showing offset distribution circuitry 58 with output terminal 66 coupled between capacitor 44 and a corresponding input of comparator 40 is merely illustrative. FIGS.

Figure 5A:
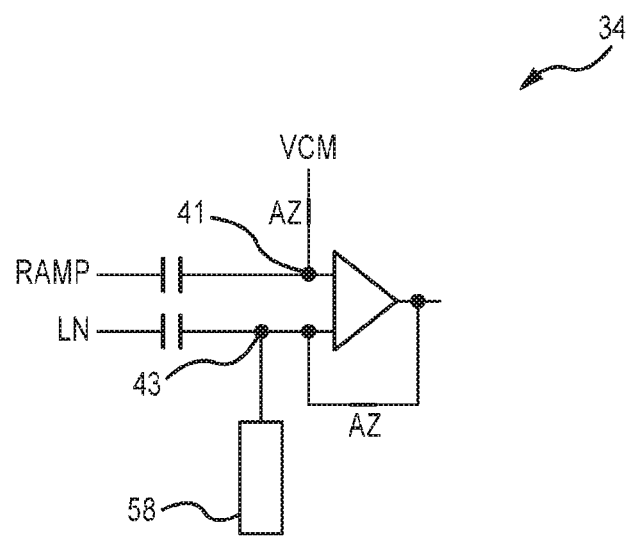
FIGS. 5A-5D are illustrative block diagrams of various configurations for offset distribution circuitry within a single unit of ADC circuit in accordance with multiple embodiments.
Figure 5B:
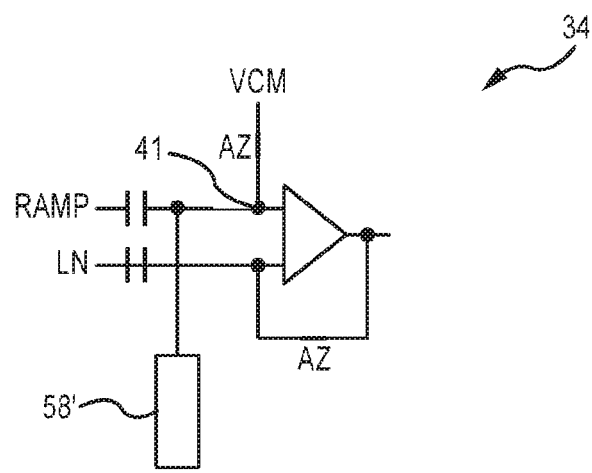

5A-5D shows various configurations of offset distribution circuitry 58 within ADC circuit 34. FIG. 5A shows an illustrative block diagram that shows offset distribution circuitry 58 in the same configuration as described in FIG. 4. In particular, offset distribution circuitry 58 may be coupled to node 43 of ADC circuitry 34. Node 43 may be between capacitor 44 and a corresponding terminal of comparator 40 (e.g., input terminal that receives analog signals). FIG. 5B shows an illustrative block diagram of ADC circuitry 34 having offset distribution circuitry 58' with an output coupled between capacitor 42 and a corresponding input of comparator 40 (e.g., coupled to node 41). Offset distribution circuitry 58' may include the same components as offset distribution circuitry 58. If desired, offset distribution circuitry 58' may include similar components with different parameter types and values.

Figure 5C:
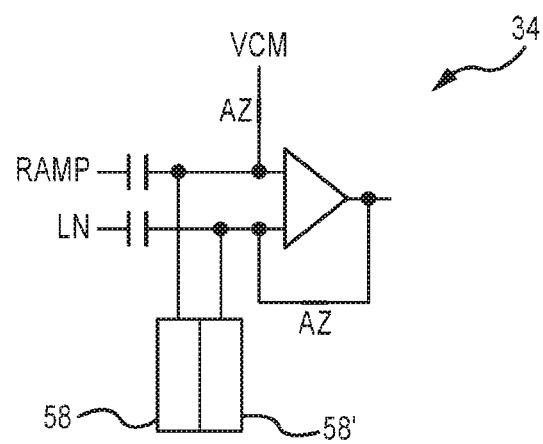
Figure 5D:
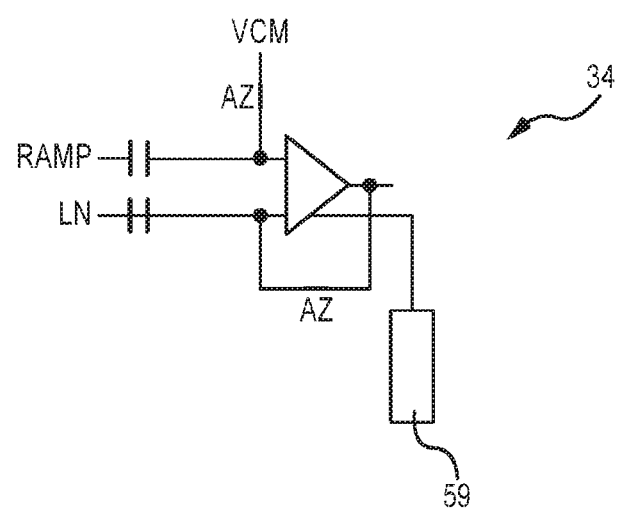

FIG. 5C shows an illustrative block diagram of ADC circuit 34 having offset distribution circuitry 58 and 58' with their respective outputs coupled to nodes 43 and 41, respectively. FIG. 5D shows an illustrative block diagram of ADC circuitry 34 having offset distribution circuitry 59 directed coupled to circuitry within comparator 40. In other words, offset distribution circuitry 59 may be coupled to any desirable terminal (e.g., another input terminal, an inner node) within comparator 40. By coupling offset distribution circuitry 59 to the inner node within comparator 40, a systematic offset may be generated for comparator 40. Offset distribution circuitry 59 may include the same components as offset distribution circuitry 58. If desired, offset distribution circuitry 59 may include similar components with different parameter types and values.

FIGS. 5A-5D are merely illustrative. If desired, a combination of different configurations as shown in FIGS. 5A-5D may be implemented as different ADC circuits 34 in different columns of array 20. For example, a first column may use ADC circuit 34 as shown in FIG. 5A, while a second column may use ADC circuit 34 as shown in FIG. 5B. A third column may use ADC circuit 34 as shown in FIG. 5C, while a fourth column may use ADC circuit 34 as shown in FIG. 5D. Alternatively, all columns may use ADC circuit 34 as shown in FIG. 5C.

Figure 6A:
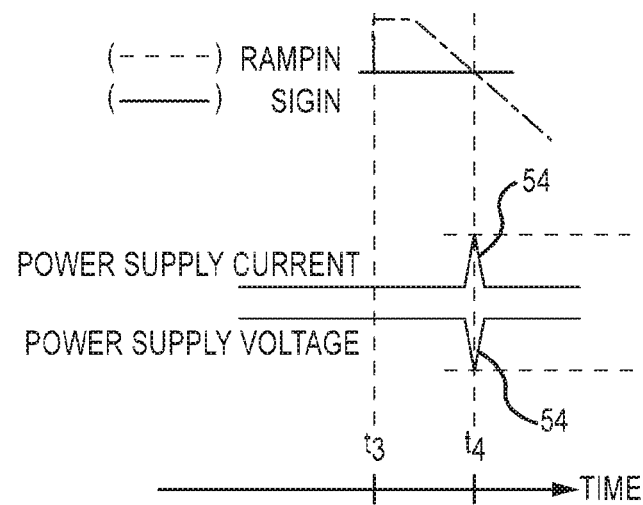
FIG. 6A is a simplified timing diagram for simultaneously operating multiple units of ADC circuits of the type shown in FIG. 3A within ADC circuitry.
Figure 6B:
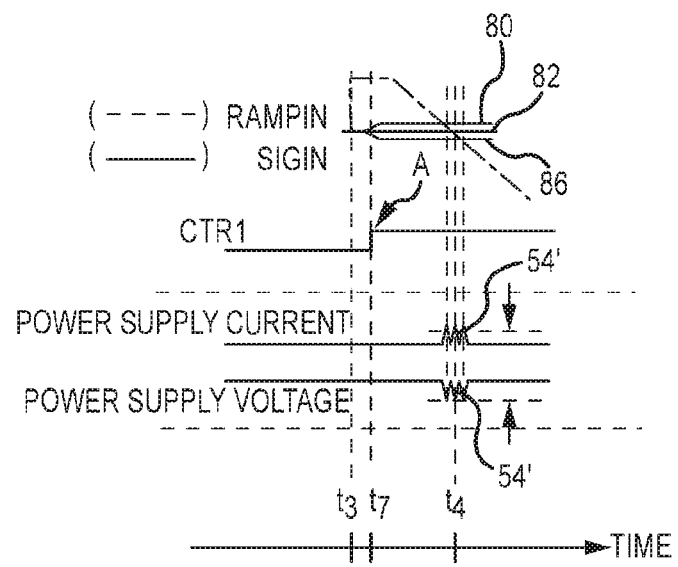
FIG. 6B is an illustrative timing diagram for simultaneously operating multiple units of ADC circuits of the type shown in FIG. 5A within ADC circuitry that includes offset distribution capabilities in accordance with an embodiment.

FIG. 6A shows a simplified version of the timing diagram as shown in FIG. 3C to highlight the effects of including offset distribution circuitry 58 or 58' within ADC circuit 34. For example, FIG. 6B is an illustrative timing diagram for operating ADC circuit 34 of the type shown in FIG. 5A. In particular, columns of array 20 may all be coupled to ADC circuit 34 of the type shown in FIG. 5A. A first subset of columns may be coupled to a first group of ADC circuits injected with negative offset (e.g., an offset voltage that raises the voltage level of signal SIGIN) using offset distribution circuitry 58. A second subset of columns may be coupled to a second group of ADC circuits that are not injected with an offset. A third subset of columns may be coupled to a third group of ADC circuits injected with a positive offset (e.g., an offset voltage that lowers the voltage level of signal SIGIN) using offset distribution circuitry 58.

In FIG. 6B, at time t3, similar operations begin as described in connection with FIG. 3C. In particular, respective SIGIN signals for first, second, and third groups of ADC circuits are all the same. At time t7, timing signal CTR1 may be asserted (e.g., enabled using assertion A, changed from a logic low to a logic high value). When timing signal CTR1 is asserted, offset injection by offset distribution circuitry may be activated (e.g., enabled). The first group of ADC circuits may receive signal SIGIN as in signal 80. The second group of ADC circuits may receive signal SIGIN as in signal 82. The third group of ADC circuits may receive signal SIGIN as in signal 84.

Signal RAMPIN received at the first, second, and third groups of ADC circuits may be the same before and after time t7. However, because signals SIGIN are different for the first, second, and third groups of ADC circuits. The time at which signal RAMPIN is equal to signal SIGNIN may be different for each of the first, second, and third groups of ADC circuits. For example, because the second group of ADC circuits had no offset injections, signal RAMPIN is equal to signal SIGIN at time t4 as previously described. Because the first group of ADC circuits had negative offset injections, signal RAMPIN may be equal to signal SIGIN before time t4 (e.g., signal line 80 intersects signal line RAMPIN prior to time t4). Because the third group of ADC circuits had positive offset injections, signal RAMPIN may be equal to signal SIGIN after time t4 (e.g., signal line 84 intersects signal line RAMPIN subsequent to time t4).

By having three groups of ADC circuits that use different offset injections, power supply power spike 54 (e.g., current spike, voltage drop) may be lessened and distributed across smaller power supply power spikes 54' (e.g., smaller current spikes, smaller voltage drops. FIG. 6B shows three smaller current spikes and three smaller voltage drops. However, this is merely illustrative. If desired, more than three or less than three groups of ADC circuits with different offsets may be used. The number of smaller spikes and drops corresponding to the number of grounds of ADC circuits may also be illustrative. If desired, offset distribution circuitry may distribute offset to ADC circuits randomly.

Figure 6C:
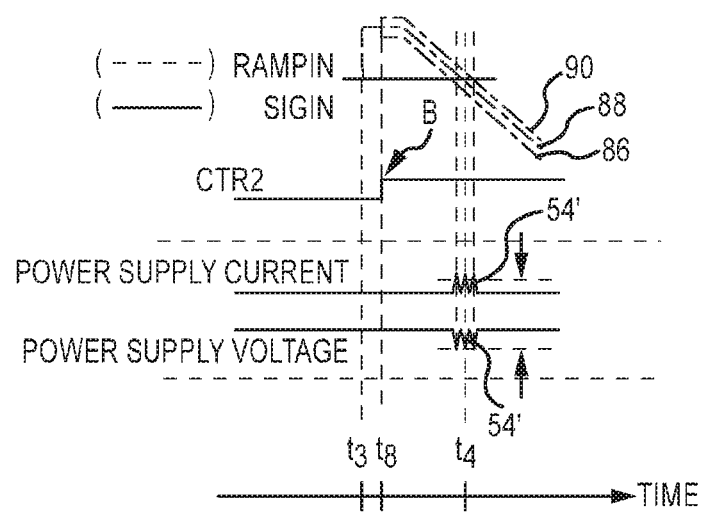
FIG. 6C is an illustrative timing diagram for simultaneously operating multiple units of ADC circuits of the type shown in FIG. 5B within ADC circuitry that includes offset distribution capabilities in accordance with an embodiment.

In another example, FIG. 6C is an illustrative timing diagram for operating ADC circuit 34 of the type shown in FIG. 5B. In particular, columns of array 20 may all be coupled to ADC circuitry 34 of the type shown in FIG. 5B. A first subset of columns may be coupled to a first group of ADC circuits injected with negative offset (e.g., an offset voltage that raises the voltage level of signal RAMPIN) using offset distribution circuitry 58'. A second subset of columns may be coupled to a second group of ADC circuits that are not injected with an offset. A third subset of columns may be coupled to a third group of ADC circuits injected with a positive offset (e.g., an offset voltage that lowers the voltage level of signal RAMPIN) using offset distribution circuitry 58'.

In FIG. 6C, at time t3, similar operations begin as described in connection with FIG. 3C. In particular, respective RAMPIN signals for fourth, fifth, and sixth groups of ADC circuits are all the same. At time t8, timing signal CTR2 may be asserted (e.g., enabled using assertion B, changed from a logic low to a logic high value). When timing signal CTR2 is asserted, offset injection by offset distribution circuitry may be activated (e.g., enabled). The fourth group of ADC circuits may receive signal RAMPIN as in signal 86. The fifth group of ADC circuits may receive signal RAMPIN as in signal 88. The sixth group of ADC circuits may receive signal RAMPIN as in signal 90.

Signal SIGIN received at the fourth, fifth, and sixth groups of ADC circuits may be the same before and after time t8. However, because signals RAMPIN are different for the fourth, fifth, and sixth groups of ADC circuits. The time at which signal RAMPIN is equal to signal SIGNIN may be different for each of the fourth, fifth, and sixth groups of ADC circuits. For example, because the fifth group of ADC circuits had no offset injections, signal RAMPIN is equal to signal SIGIN at time t4 as previously described. Because the fourth group of ADC circuits had negative offset injections, signal RAMPIN may be equal to signal SIGIN before time t4 (e.g., signal line 86 intersects signal line SIGIN prior to time t4). Because the sixth group of ADC circuits had positive offset injections, signal RAMPIN may be equal to signal SIGIN after time t4 (e.g., signal line 90 intersects signal line SIGIN subsequent to time t4).

By having three groups of ADC circuits that use different offset injections, power supply power spike 54 (e.g., current spike, voltage drop) may be lessened and distributed across smaller power supply power spikes 54'(e.g., smaller current spikes, smaller voltage drops. FIG. 6C shows three smaller current spikes and three smaller voltage drops. However, this is merely illustrative. If desired, more than three or less than three groups of ADC circuits with different offsets may be used. The number of smaller spikes and drops corresponding to the number of grounds of ADC circuits may also be illustrative. If desired, offset distribution circuitry may distribute offset to ADC circuits randomly. By spreading out power spike 54 across smaller spikes, power supply noise and kickback noise may be lessened. By lessening power supply noise and kickback noise, ADC counting inaccuracies, row banding, and linearity errors can be minimized.

Figure 7A:
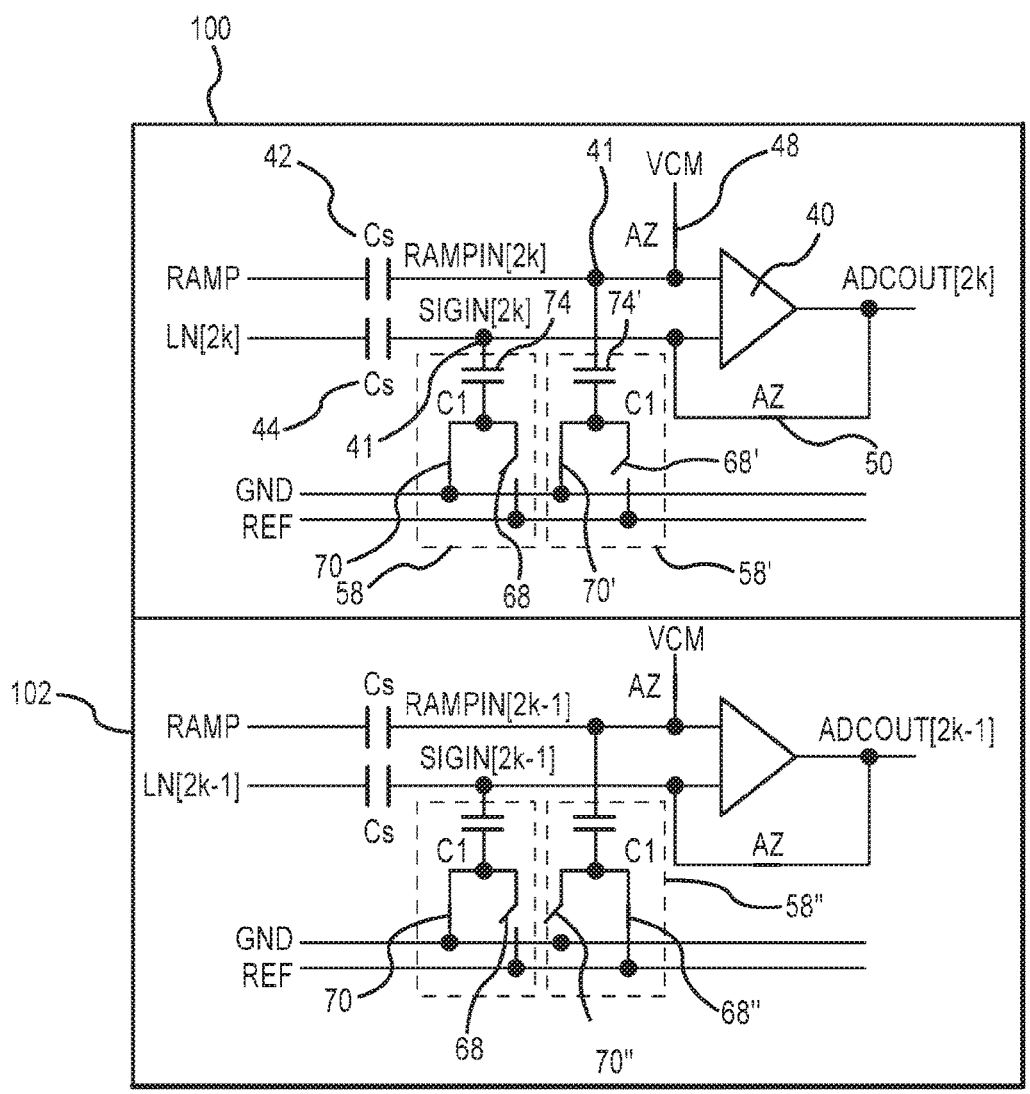
FIG. 7A is an illustrative circuit diagram of configurations for ADC circuitry that includes offset distribution capabilities based on the parity of columns in an image pixel array in accordance with an embodiment.
Figure 7B:
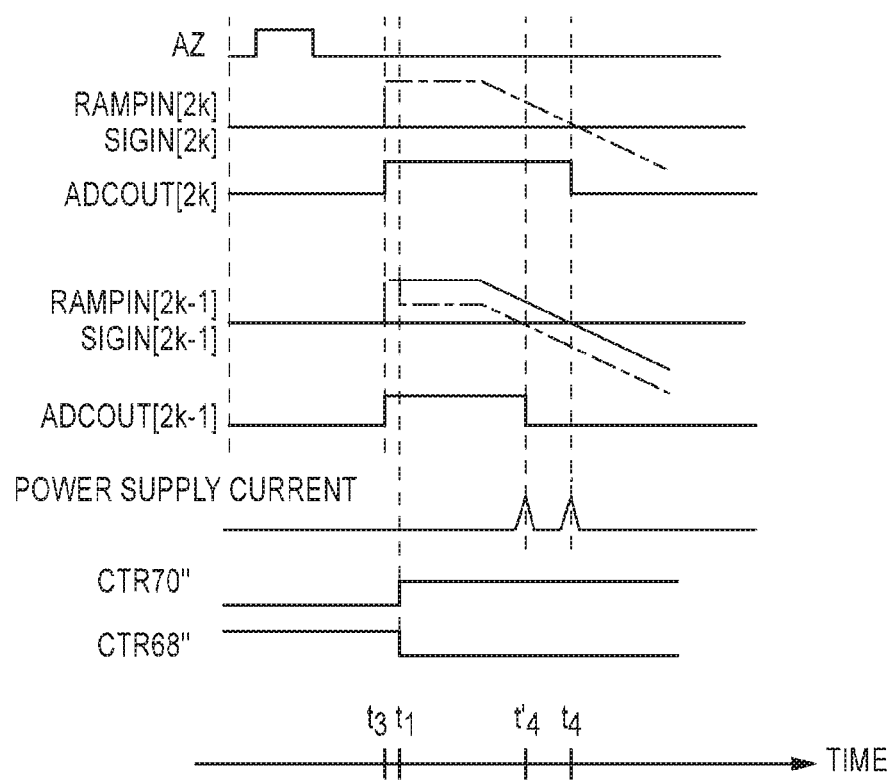
FIG. 7B is an illustrative timing diagram for operating ADC circuitry of the type shown in FIG. 7A in accordance with an embodiment.

Varying types of ADC circuits may be implemented with varying amounts of offset, if desired. FIGS. 5-6 are merely illustrative. FIGS. 7A and 7B describe an exemplary configuration of ADC circuits 34 within ADC circuitry 35 and its operations. Some elements described previously in connection to FIGS. 5-6 are not further described in order to not obscure the embodiments of FIG. 7A. Unless otherwise, suggested similar component may serve the same functions as previously described.

FIG. 7A may include portions 100 and 102 relating to configuration of ADC circuits 34 within ADC circuitry 35. Portion 100 describes a first set of ADC circuits 34, each of which is coupled to a respective even column of array 20. The first set of ADC circuits 34 may receive signals LN[2k], where [2k] may be used to signify even columns for any signal (e.g., LN, RAMPIN, SIGIN, ADCOUT). The first set of ADC circuits 34, each of the type shown in FIG. 5C may be include offset distribution circuitry 58 and 58' coupled to nodes 43 and 41, respectively. Switch 70 within offset distribution circuitry 58 may be closed to enable a ground terminal to be coupled with node 43 via capacitor 74. Switch 68 may be opened to disable a connection between a reference voltage and node 43 via capacitor 74. Switch 70' within offset distribution circuitry 58' may be closed to enable the ground terminal to be coupled to node 41 via capacitor 74'. Switch 68' may be opened to disable a connection between the reference voltage and node 41 via capacitor 74'. If desired, switches 68, 70, 68' and 70' may be controlled using control signals generated by decoder 72 (not shown in FIG. 7A).

Portion 102 describes a second set of ADC circuits 34, each of which is coupled to a respective odd column of array 20. The second set of ADC circuits 34 may receive signals LN[2k-1], where [2k-1] may be used to signify odd columns for any signal (e.g., LN, RAMPIN, SIGIN, ADCOUT). The second set of ADC circuits 34, each of the type shown in FIG. 5C may be include offset distribution circuitry 58 and 58' coupled to nodes 43 and 41, respectively. Switch 70 within offset distribution circuitry 58 may be closed to enable a ground terminal to be coupled to node 43 via capacitor 74. Switch 68 may be opened to disable a connection between a reference voltage and node 43 via capacitor 74. Switch 70' within offset distribution circuitry 58' may be opened to disable a connection between the ground terminal and node 41 via capacitor 74'. Switch 68' may be closed to enable the reference voltage to be coupled to node 41 via capacitor 74'.

FIG. 7B is an illustrative timing diagram showing the operation of ADC circuitry 34 having the configuration as described in FIG. 7A. In particular, signals RAMPIN[2k], SIGIN[2k], and ADCOUT[2k] for even columns are similar to those described previously in connection with line 88 FIG. 6C, where there is no injected offset. Signal RAMPIN [2k-1], SIGIN[2k-1], and ADCOUT[2k-1] for odd columns are similar to those described previously in connection with line 86 of FIG. 6C, where there is a positive injection. As an example of operating both even column and odd column ADCs, even column ADCs may remain at their current configuration as shown in portion 100 throughout an entire time period shown in FIG. 7B. Odd column ADCs may change their configuration to selectively implement the configuration of portion 102 in FIG. 7A and perform offset distribution (e.g., at time t9). As shown in FIG. 7B, before time t9, control signal CTR70" may be deasserted to keep switch 70" of odd column ADCs open (e.g., disabled) and control signal CTR68" may be asserted to keep switch 68" of odd column ADCs closed (e.g., enabled). After time t9, control signal CTR70" may be asserted to keep switch 70" of odd column ADCs closed and control signal CTR68" may be asserted to keep switch 68" of odd column ADCs open to inject an offset voltage to the odd column ADCs. At time t4, RAMPIN[2k] may be equal to SIGIN[2k]. Therefore, even column ADC circuitry may simultaneously invert its corresponding circuitry and generate a first current spike. At time t4', prior to time t4, RAMPIN[2k-1] may be equal to SIGIN[2k-1]. Therefore, odd column ADC circuitry may simultaneously invert its corresponding circuitry and generate a second current spike. The first and second current spikes are spread out instead of combined, which would have been more detrimental to the operation of ADC circuitry 34.

Figure 8:
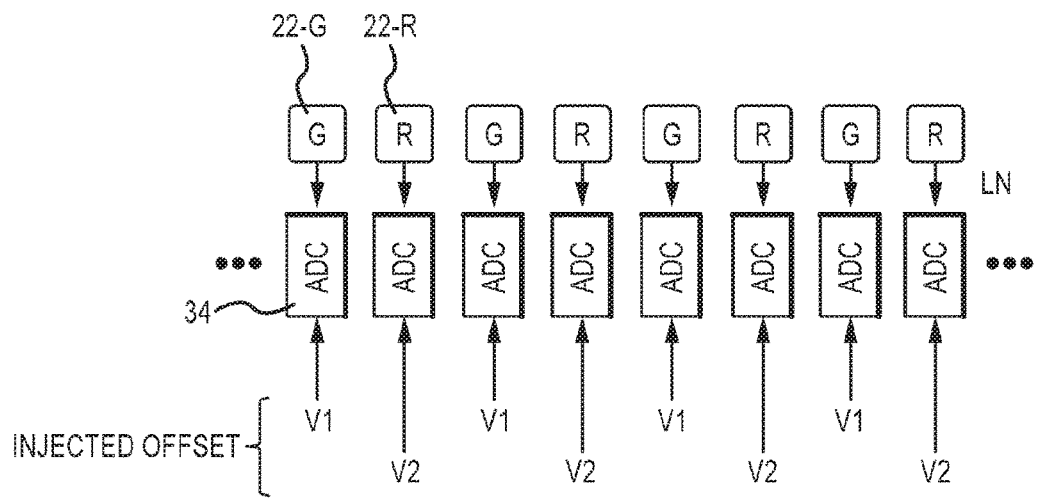
FIG. 8 is an illustrative block diagram of configurations for ADC circuitry that includes offset distribution capabilities based on pixel color type within an image pixel array in accordance with an embodiment.

Alternatively, FIG. 8 shows ADC circuitry 35 that implements various configurations of offset distribution circuitry according to a color-type of a pixel readout (e.g., color separation offset) for multiple ADC units 34. For example, when reading out analog signals from green pixel 22-G and converting the analog signals from green pixel 22-G into corresponding digital signals using unit ADC 34, a first voltage V1 may be injected into the corresponding unit ADC 34. In other words, the first voltage is injected into the corresponding unit ADC 34 across all columns performing analog-to-digital conversion for green pixels 22-G of array 20. When reading out analog signals from red pixel 22-R and converting the analog signals from red pixel 22-R into corresponding digital signals using unit ADC 34, a second voltage may be injected into the corresponding unit ADC 34. In other words, the first voltage is injected into the corresponding unit ADC 34 across all columns performing analog-to-digital conversion for green pixels 22-R of array 20.

Signals for various colors may be collectively readout. For example, in a single readout cycle multiple green image signals may be readout from various columns and received at corresponding ADC circuits 34. Multiple red image signals may be readout from various columns and received at corresponding ADC circuits 34. To reduce quantization systematic noise caused by different offset injections for signals of a given color (e.g., green or red), an exemplary configuration such as the one shown in FIG. 8 may be used.

FIG. 8 is merely illustrative. If desired, ADC circuitry coupled to any type of pixels may be injected a different voltage. For example, when performing analog-to-digital conversion for blue pixels (not shown in FIG. 8), the corresponding ADC may be injected with a third voltage. For example, when performing analog-to-digital conversion for clear pixels (not shown in FIG. 8), the corresponding ADC may be injected with a fourth voltage. For example, when performing analog-to-digital conversion for yellow pixels (not shown in FIG. 8), the corresponding ADC may be injected with a fifth voltage. Furthermore, the injected voltage corresponding to each specific type of pixel may change over time, if desired.

In accordance with an embodiment, it may be desirable to relate the amount of injected offset voltage to an analog gain setting of ADC unit circuits 34 (e.g., corresponding to the analog gain of the input analog signal for ADC unit circuits 34). For example, if a high gain analog signal is received at ADC unit circuit 34, ADC circuit 34 may operate in a high gain setting. For example, if a low gain analog signal is received at ADC unit circuit 34, ADC circuit 34 may operate in a low gain setting. At high analog gain of ADC circuitry 34, ramp slope of the ramp waveform is not very steep and device random noise is dominant. Therefore, the device random noise may distribute noise to reduce power spikes in ADC circuitry 34. However, at low analog gain, the ramp slope is steep and analog auto-zero may remove most dominant noise, therefore offset distribution may be implemented.

Figure 9:
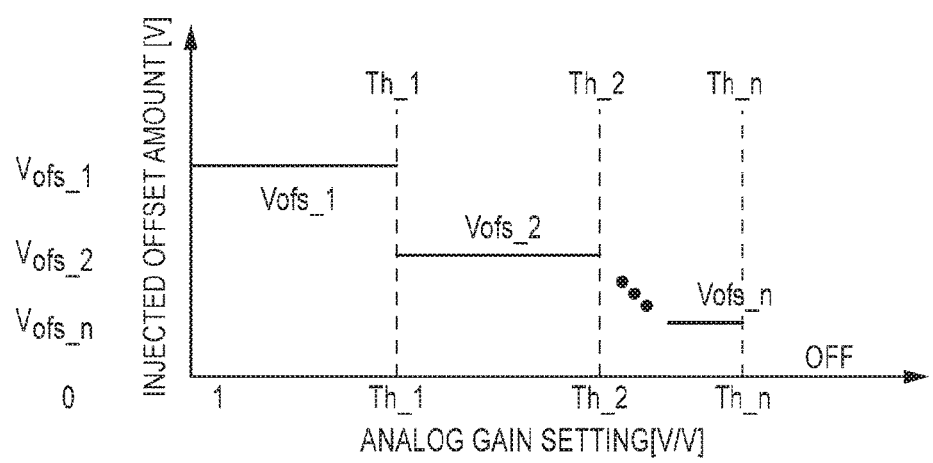
FIG. 9 is an illustrative graph showing an exemplary relationship between injected offset voltage and analog gain setting of the ADC circuitry in accordance with an embodiment.

As shown in FIG. 9, at low analog gain setting for a corresponding ADC unit circuit 34, the injected offset voltage may be high. Alternatively, at high analog gain setting for another corresponding ADC unit circuit 34, the injected offset voltage may be low or zero. For example, below an analog gain setting of Th_1, the injected offset amount in terms of voltage may be voltage Vofs_1. For example, above an analog gain setting of Vofs_1 and below an analog gain setting of Th_2, the injected offset amount in terms of voltage may be voltage Vofs_2. Voltage Vofs_1 may be a higher voltage than voltage Vofs_2. For example, above an analog gain setting of Vofs_2 and below an analog gain setting of Th_3 (not shown), the injected offset amount in terms of voltage may be voltage Vofs_3 (not shown). Voltage Vofs_2 may be a higher voltage than voltage Vofs_3. This pattern may be followed until reading a desired analog gain setting of Th_n, where above gain Th_n, no injected voltage may be introduced to the corresponding ADC unit circuit 34 (e.g., at an input of comparator 40 within ADC unit circuit 34.

Figure 10:
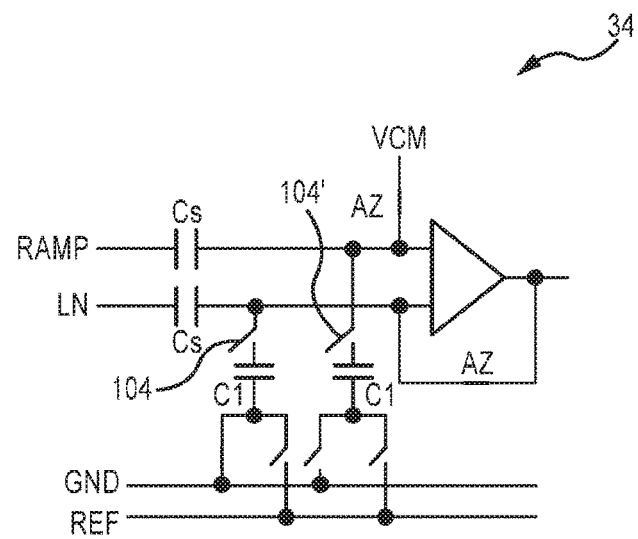
FIG. 10 is an illustrative circuit diagram of ADC circuitry that includes offset distribution circuitry and switching circuitry which selectively enable offset distribution capabilities in accordance with an embodiment.

However, when no injected voltage is provided to the corresponding ADC unit circuit, the corresponding ADC unit circuit may suffer from higher noise because of capacitor 74. Therefore, according to the embodiment of FIG. 8, it may be desirable to selectively enable (e.g., coupled) offset distribution circuitry 58, 58', and 59 to ADC circuitry 34. As shown in FIG. 10, switches 104, and 104' (sometimes referred to herein as master switches 104 and 104') within offset distribution circuitry 58 and 58', respectively may be implemented. The state of switches 104 and 104' may be controlled by a control signal that disables switches 104 and 104' when a high signal of high analog gain (e.g., above gain Th_n) is reached. Alternatively switches 104 and 104' may remained closed (e.g., enabled) during all other times. If desired, the state of switches 104 and 104' may be controlled by decoder 72 (not shown in FIG. 10) using control signals.

Figure 11A:
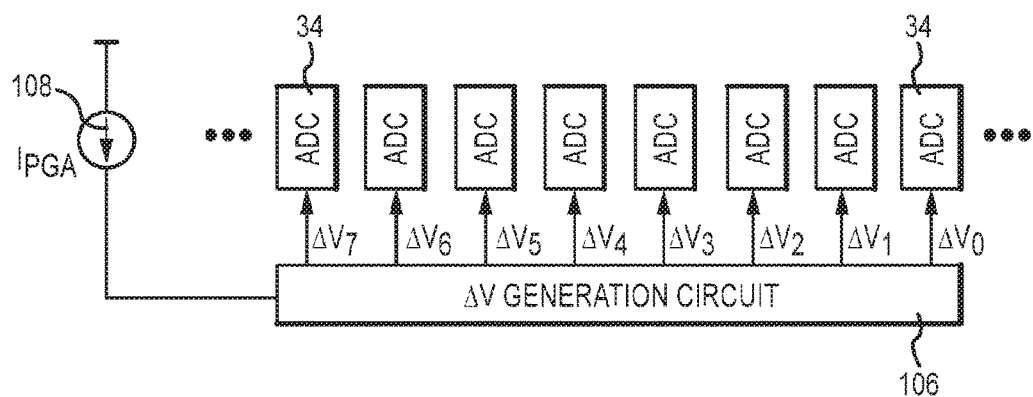
FIG. 11A is an illustrative block diagram of configurations for ADC circuitry that includes offset distribution capabilities based on an analog gain setting of the ADC circuitry in accordance with an embodiment.
Figure 11B:
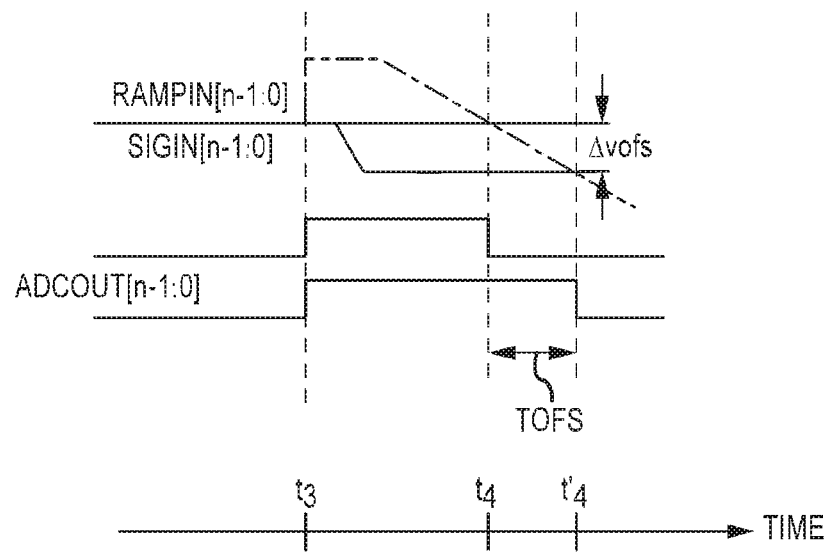
FIGS. 11B and 11C are illustrative timing diagrams for operating ADC circuitry of the type shown in FIG. 11A in accordance with an embodiment.
Figure 11C:
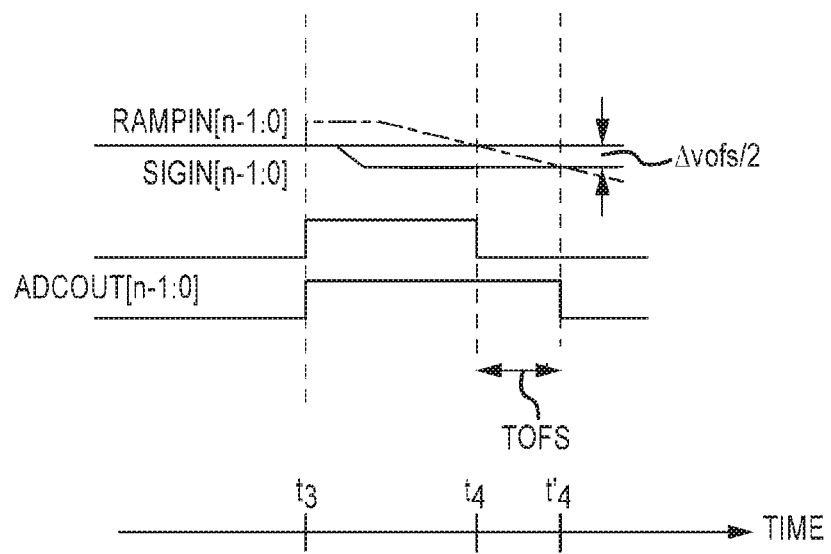

In accordance with an embodiment, FIGS. 11A-11C shows circuitry for generating the reference voltage REF received by ADC circuitry 34 such that reference voltage REF may be inversely proportion to the analog gain of the received signal. As shown in FIG. 11A, voltage generation circuit 106 may prove different reference voltages (e.g., voltages $\Delta V_0$, $\Delta V_1$, ..., $\Delta V_7$) to ADC unit circuits 34. Voltage generation circuit 106 may receive current $I_{PGA}$ from current source 108 that is used to generate different reference voltages. Current $I_{PGA}$ may be controlled to be correlated to the analog gain setting of ADC circuits 34. For example, current $I_{PGA}$ may be inversely proportional to the analog gain setting of ADC circuits 34. Consequently, different reference voltages provided by voltage generation circuit 106 may also be inversely proportional to the analog gain setting of ADC circuits 34. In other words, reference voltages REF provided to ADC circuits 34 may be proportional to the slope of the ramp waveforms received at ADC circuits 34.

As shown in a comparison between FIGS. 11B and 11C. At an analog gain of 1, the provided reference voltage REF corresponds to the injected offset voltage Vofs. A time period between comparator inversions with and without the injected offset voltage Vofs is shown as time period Tofs in FIG. 11B. At an analog gain of 2, the provided reference voltage REF corresponds to the injected offset voltage Vofs/2, which is half of the injected offset voltage in the analog gain of 1 scenario. The same time period Tofs is shown in FIG. 11C, as the time period between comparator inversions with and without the injected offset voltage Vofs/2. The time period Tofs is constant between the two scenarios because the injected offset voltage is proportional to the ramp slope. The ramp slope (e.g., the slope of signal RAMPIN during ramping) is steeper for the gain of 1 scenario than for the scenario for gain of 2.

Figure 12:
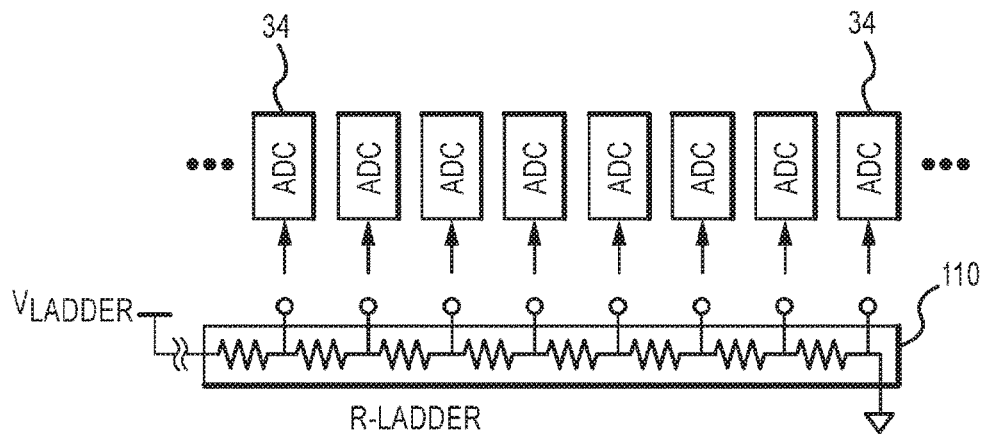
FIG. 12 is an illustrative block diagram of configurations for ADC circuitry that includes offset distribution capabilities based on a resistor ladder in accordance with an embodiment.

In accordance with an embodiment, a different offset distribution scheme as shown in FIG. 12 may be implemented. As shown in FIG. 12, resistor ladder 110 may be used to generate and output different reference voltages REF to various ADC unit circuits 34 in accordance with Ohm's law. Voltage $V_{Ladder}$ may be provided to one end of resistor ladder 110 and a ground voltage may be provided to another end of resistor ladder 110. However, this is merely illustrative. If desired, any two voltage sources with any two desired voltages may be coupled the respective ends of resistor ladder 110.

At each terminal between every resistor, a voltage may be provided as reference voltage REF to a corresponding unit ADC 34 in accordance with Ohm's law. Any number of resistors of any combination of resistance values may be used to adjust the reference voltages generated by resistor ladder 110.

Figure 13:
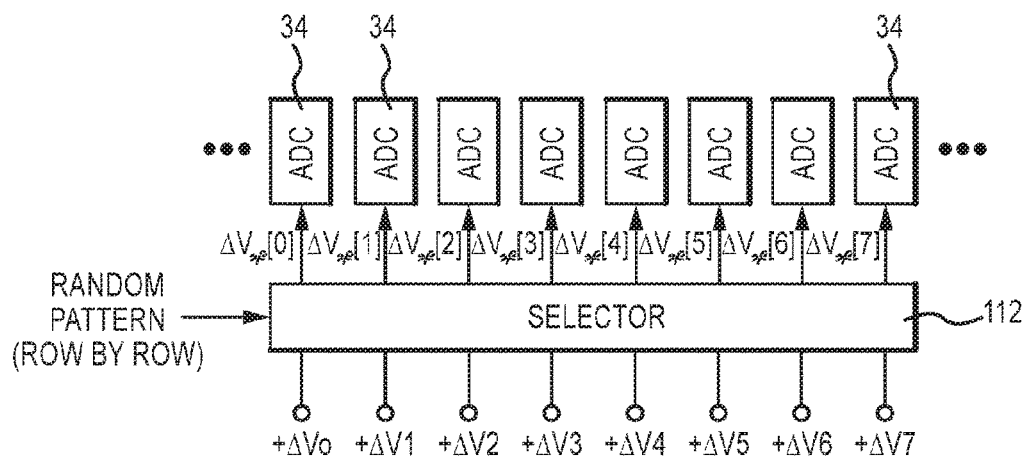
FIG. 13 is an illustrative block diagram of configurations for ADC circuitry that includes offset distribution capabilities based on random offset distribution in accordance with an embodiment.

In accordance with an embodiment, an offset distribution scheme as shown in FIG. 13 may be implemented. As shown in FIG. 13, selector 112 may be used to couple a set of input voltages (e.g., voltages $\Delta V_0$, $\Delta V_1$, ..., $\Delta V_7$) to ADC circuits 34 as reference voltages that may serve as offset voltages (e.g., voltages $\Delta V_{ofs}[0]$, $\Delta V_{ofs}[1]$, ..., $\Delta V_{ofs}[7]$). Selector 112 may change its connections of input to output after reading out each row of array 20. If fixed offset (e.g., a fixed reference voltage) is always given to each corresponding ADC, quantization vertical line noise may be present in a final image. To reduce the quantization vertical line noise or the chances of having quantization vertical line noise, injected offset amount may be changed after each row to predetermined random amounts.

Figure 14:
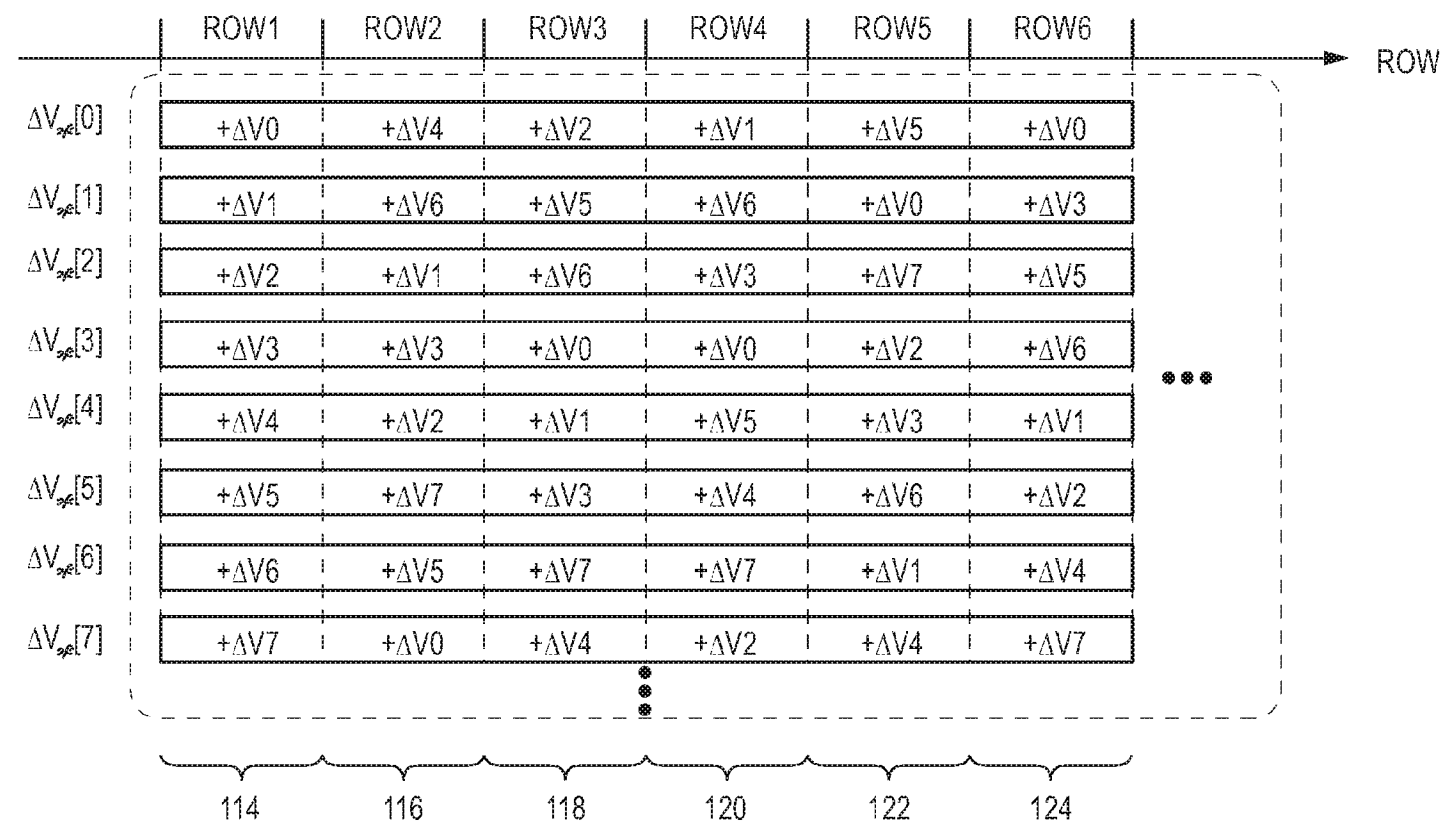

FIG. 14 shows a timing table of the random predetermined random amounts of injected voltage in a timing diagram. During analog-to-digital conversion of data from row1, a set of predetermined injected voltages shown as set 114 may be supplied to respective ADC circuits 34 as different offset voltages (e.g., $V_{ofs}[0]$, $V_{ofs}[1]$, ..., $V_{ofs}[7]$).

During analog-to-digital conversion of data from row2, a set of predetermined injected voltages shown as set 116 may be supplied to respective ADC circuits 34 as different offset voltages. During analog-to-digital conversion of data from row3, a set of predetermined injected voltages shown as set 118 may be supplied to respective ADC circuits 34 as different offset voltages. During analog-to-digital conversion of data from row4, a set of predetermined injected voltages shown as set 120 may be supplied to respective ADC circuits 34 as different offset voltages. During analog-to-digital conversion of data from row5, a set of predetermined injected voltages shown as set 122 may be supplied to respective ADC circuits 34 as different offset voltages. During analog-to-digital conversion of data from row6, a set of predetermined injected voltages shown as set 124 may be supplied to respective ADC circuits 34 as different offset voltages.

In other words, FIG. 14 shows a schedule of different sets of offset voltages be supplied to different terminals at different given times. The different given times may refer to a readout schedule corresponding to ADC receiving analog signals from different rows.

The example of seven different offset voltages and six rows as shown in FIG. 14 is merely illustrative. If desired, any number of different offset voltages may be provided to any number of ADC circuits. If desired, predetermined injected voltages may be generated for more than six rows at a time, and may reference to maintain a desired number of predetermined sets of injected voltages.

FIGS. 7-14 shows illustrative configurations of offset distribution circuitry. If desired, any number of embodiments may be used to implement a desired system of ADC circuitry using offset distribution circuitry. The examples in these figures of using a specific number of ADC unit circuits are merely illustrative. These embodiments may use any number of ADC unit circuits and a corresponding number of support circuitry (e.g., selector circuitry, resistor ladders, switching circuitry, etc.).

The embodiments shown in FIGS. 4-14 are not limited to column single slope ADC architecture. If desired, these embodiments may be implemented in any single slope ADC architecture. If desired, these embodiments may also be implemented in any suitable multi-ADC architecture.

Figure 15:
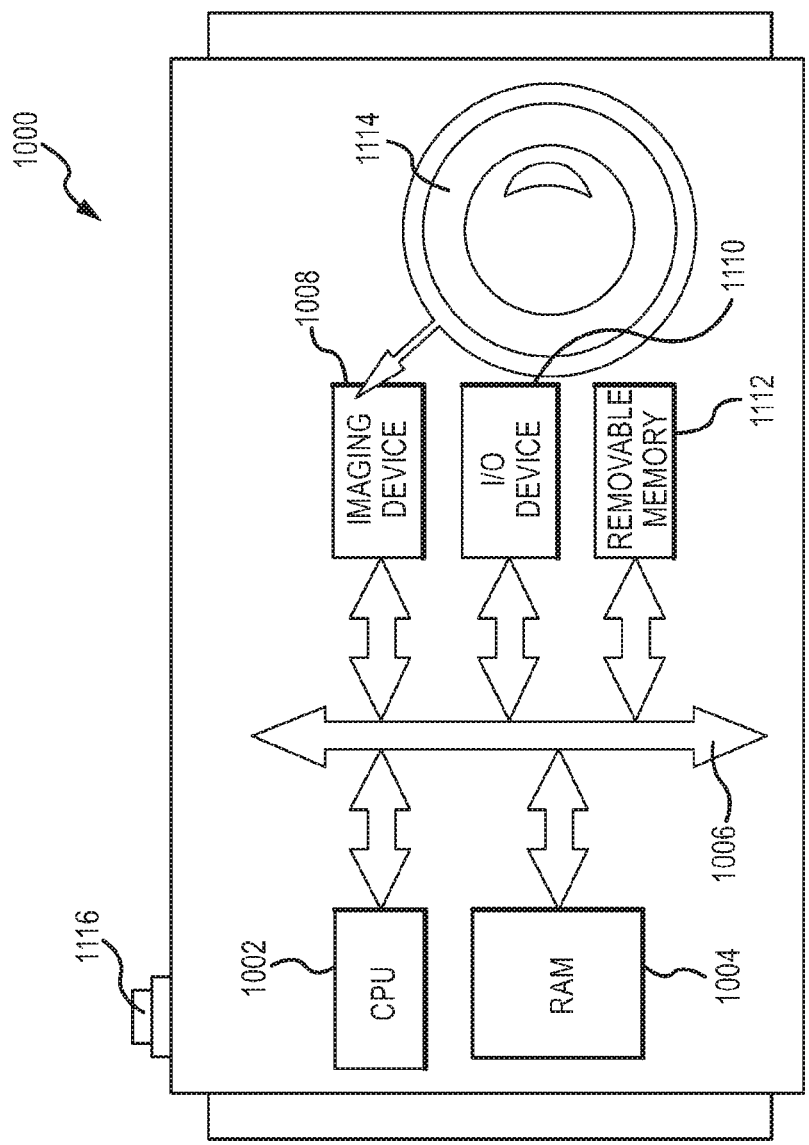
FIG. 15 is a block diagram of a processor system that may employ some of the embodiments of FIGS. 1-14 in accordance with an embodiment of the present invention.

FIG. 15 is a simplified diagram of an illustrative processor system 1000, such as a digital camera, which includes an imaging device 1008 (e.g., the camera module of FIG. 1) employing an imager having ADC circuitry as described above in connection with FIGS. 1-14. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating systems and methods relating to analog-to-digital converter (ADC) circuitry that includes offset distribution capabilities. In particular, ADC circuitry may include multiple units of ADCs.

A signal unit of ADC may receive an analog signal and output a corresponding digital signal corresponding to the analog signal (i.e., a conversion process). The analog signals may be reset signals or low gain signals. During the conversion process, a comparator may receive the analog signal and a ramp waveform and compare the two inputs to generate a logic signal. Latch memory circuitry may receive the logic signal and generate the digital data corresponding to the analog signal. The unit ADC may further include a first auto zero switch interposed between a first input and the output of the comparator and a second auto zero switch interposed between a second input and a voltage supply providing a reset voltage.

To enable offset distribution capabilities, offset distribution circuitry (e.g., offset injection circuitry) may be selectively coupled to at least one of the inputs of the comparator via a master switch. The offset distribution circuitry may include a first switch that couples a ground terminal to the at least one of the inputs of the comparator via a capacitor and a second switch that couples a voltage supply providing a reference voltage to the at least one of the inputs of the comparator via the capacitor. The reference voltage is conveyed via the capacitor to the at least one of the inputs of the comparator as the offset voltage.

ADC circuitry may include multiple units of ADC that include offset distribution circuitry. ADC circuitry may include a unit of ADC for every column of an array of image pixels, where the column output line is coupled to the respective column ADC. In particular, a first column may be coupled to a first ADC and a second column may be coupled to a second ADC. First and second ADCs may include offset injection circuitry that inject respectively first and second offset voltages to the first and second ADCs (e.g., inject respectively first and second offset voltages to respective first and second comparators within the first and second ADCs).

The first and second offset voltages may be determined by resistor ladder circuitry that includes a plurality of resistors coupled in series, wherein terminals between the plurality of resistors determine the offset voltages. The first and second offset voltages may be determined by selector circuitry that generates output voltages corresponding the offset voltages by randomly selecting voltages from a set of voltages in a predetermined schedule based on a readout of different rows within the array of image pixels. The first and second offset voltages may be determined by voltage generation circuitry that generates outputs voltages proportional to analog gain settings of the first and second unit ADCs, wherein the outputs voltages correspond to the offset voltages.

When converting analog signals for first and second pixels within first and second columns, respectively, the first pixel may be of a first color and the second pixel may be of a second color that is different from the first.

The foregoing is merely illustrative of the principles of this invention and various modifications can be made by those skilled in the art without departing from the scope and spirit of the invention. The foregoing embodiments may be implemented individually or in any combination.

What is claimed is:

1. An analog-to-digital converter that receives an analog signal and outputs digital data corresponding to the analog signal, comprising:
   a comparator having an input terminal and an output terminal, wherein the analog signal received by the comparator is used to generate a logic signal, and wherein the output terminal outputs the logic signal;
   circuitry that receives the logic signal from the comparator and that generates the digital data corresponding to the analog signal; and
   offset distribution circuitry coupled to the input terminal of the comparator that selectively injects an offset voltage to the input terminal of the comparator, wherein the offset distribution circuitry comprises:
      a switch that selectively couples a ground terminal to the input terminal of the comparator; and
      a capacitor interposed between the switch and the input terminal of the comparator.

2. The analog-to-digital converter defined in claim 1, wherein the offset distribution circuitry further comprises:
   an additional switch that selectively couples a voltage supply providing a reference voltage to the input terminal of the comparator, wherein the capacitor is interposed between the additional switch and the input terminal of the comparator.

3. The analog-to-digital converter defined in claim 2, wherein the offset distribution circuitry further comprises:
   a master switch that selectively connects the offset distribution circuitry to the comparator, wherein the master switch is interposed between the capacitor and the input terminal of the comparator.

4. The analog-to-digital converter defined in claim 1, wherein the input terminal of the comparator receives a ramp waveform that is compared to the analog signal using the comparator to generate the logic signal.

5. The analog-to-digital converter defined in claim 1, wherein the input terminal of the comparator receives the analog signal, and wherein the comparator comprises:
   an additional input terminal that receives a ramp waveform that is compared to the analog signal using the comparator to generate the logic signal.

6. The analog-to-digital converter defined in claim 5, further comprising:
   additional offset distribution circuitry coupled to the additional input terminal of the comparator that selectively injects an additional offset voltage to the additional input terminal of the comparator.

7. The analog-to-digital converter defined in claim 6, further comprising:
   a first auto zero switch interposed between the input terminal and the output terminal of the comparator; and
   a second auto zero switch that couples a voltage supply providing a reset voltage to the additional input terminal of the comparator.

8. The analog-to-digital converter defined in claim 6, wherein the input terminal receives the analog signal via a first input capacitor, and wherein the additional input terminal receives the ramp waveform via a second input capacitor.

9. The analog-to-digital converter defined in claim 1, wherein the switch selectively couples the ground terminal to the input terminal of the comparator via the capacitor.

10. A method of operating an image sensor that includes an array of pixels, wherein the array of pixels includes a first column of pixels coupled to a first analog-to-digital converter circuit and a second column of pixels coupled to a second analog-to-digital converter circuit, the method comprising:
    using a first pixel within the first column, providing a first analog signal to the first analog-to-digital converter circuit;
    using a second pixel within the second column, providing a second analog signal to the second analog-to-digital converter circuit; and
    at the first analog-to-digital converter circuit, converting the first analog signal into first digital data, wherein converting the first analog signal into the first digital data comprises:
       receiving the first analog signal at an input terminal of a comparator in the first analog-to-digital converter circuit; and
       providing a first voltage offset directly at the input terminal of the comparator and to the first analog signal.

11. The method defined in claim 10, further comprising:
    using resistor ladder circuitry that includes a plurality of resistors coupled in series, determining the first voltage offset.

12. The method defined in claim 10, further comprising:
    using selector circuitry that generates output voltages by randomly selecting voltages from a set of voltages, determining the first voltage offset.

13. The method defined in claim 10, further comprising:
    using voltage generation circuitry that generates output voltages proportional to analog gain settings of the first and second analog-to-digital converter circuits, determining the first voltage offset.

14. The method defined in claim 10, wherein the first pixel comprises a pixel having a first color, and wherein the second pixel comprises a pixel having a second color that is different from the first color.

15. The method defined in claim 14, further comprising:
    at the second analog-to-digital converter circuit, converting the second analog signal into second digital data, wherein converting the second analog signal into the second digital data comprises:
       receiving the second analog signal at an input of the second analog-to-digital converter circuit; and
       providing a second voltage offset at the input of the second analog-to-digital converter circuit and to the second analog signal.

16. A system, comprising:
    a lens;
    an array of image sensor pixels arranged in rows and columns, wherein the lens focuses image light onto the array of image sensor pixels and wherein the image sensor pixels are configured to generate analog image signals in response to the image light; and
    a plurality of analog-to-digital converter units, wherein each analog-to-digital converter unit is coupled to a respective column of the array of image sensor pixels, wherein each analog-to-digital converter unit is configured to convert the analog signal from the respective column into digital pixel data corresponding to the analog signal, and wherein each analog-to-digital converter unit comprises:
       a conversion circuit that receives the analog signal from the respective column and outputs the digital pixel data corresponding to the analog signal; and
       an offset injection circuit coupled to an input terminal of the conversion circuit that provides an offset voltage to the conversion circuit, wherein a first path connects the input terminal of the conversion circuit to a first terminal of a capacitor, wherein a second path connects a second terminal of the capacitor to an input, and wherein the offset injection circuit is coupled to the first path between the input terminal of the conversion circuit and the first terminal of the capacitor.

17. The system defined in claim 16, wherein each offset injection circuit comprises:
an additional capacitor that couples portions of the offset injection circuit to the conversion circuit.

18. The system defined in claim 17, wherein each offset injection circuit receives a reference voltage that is conveyed to the conversion circuit as the offset voltage via the additional capacitor.

19. The system defined in claim 16, wherein a first offset injection circuit provides a first offset voltage to a first conversion circuit, wherein a second offset injection circuit provides a second offset voltage to a second conversion circuit, and wherein the first and second offset voltages are determined randomly.

20. The system defined in claim 19, wherein the first and second offset voltages are changed after a regular time interval associated with readout timings for rows within the image sensor array.

* * * * *